United States Patent [19]

Bargues et al.

[11] Patent Number: 5,013,274

[45] Date of Patent: May 7, 1991

[54] PROCESS FOR RESTORING LOCALLY DAMAGED PARTS, PARTICULARLY ANTICATHODES

[75] Inventors: Michel Bargues, Orange; Didier Boya, Jonquieres; Dominique Gaillard, Paris; Pierre Netter, Pont Saint-Esprit, all of France

[73] Assignee: Comurhex Societe pour la Conversion de l'Uranium en Metal et Hexafluorure, Courbevoie, France

[21] Appl. No.: 371,728

[22] Filed: Jun. 27, 1989

[30] Foreign Application Priority Data

Jun. 28, 1988 [FR] France .................. 88 08665

[51] Int. Cl.$^5$ ............................................. C23C 16/48
[52] U.S. Cl. .................................. 445/2; 29/402.01; 427/43.1; 427/53.1; 427/78; 445/28
[58] Field of Search .............. 445/2, 28; 29/402.01, 29/402.04, 402.06, 402.07; 427/43.1, 53.1, 78; 219/121.85, 121.84

[56] References Cited

U.S. PATENT DOCUMENTS

| | | | |
|---|---|---|---|
| 3,579,022 | 5/1971 | Hennig | 378/144 |
| 4,533,449 | 8/1985 | Levenstein | 204/192.26 |
| 4,562,332 | 12/1985 | Walter et al. | 219/121.85 X |
| 4,730,093 | 3/1988 | Mehta et al. | 427/53.1 X |
| 4,778,693 | 10/1988 | Drozdowicz et al. | 427/53.1 |

FOREIGN PATENT DOCUMENTS

| | | | |
|---|---|---|---|
| 0172604 | 2/1986 | European Pat. Off. | |
| 244929 | 4/1987 | German Democratic Rep. | 228/119 |
| 64-236 | 3/1988 | Japan | 427/53.1 |
| 2107628 | 5/1983 | United Kingdom | |

Primary Examiner—Kenneth J. Ramsey
Attorney, Agent, or Firm—Pearne, Gordon, McCoy & Granger

[57] ABSTRACT

Process for repairing or restoring a part with a locallly damaged surface, particularly an anticathode or target consisting of depositing in preferred manner at damaged points of said surface, preferably by chemical vapor deposition, the material constituting said part and then machining said surface in such a way that it conceals its original state.

5 Claims, No Drawings

PROCESS FOR RESTORING LOCALLY DAMAGED PARTS, PARTICULARLY ANTICATHODES

DESCRIPTION

The present invention relates to a process for repairing or restoring locally damaged parts, particularly anticathodes or targets. It more particularly applies to the repair by chemical vapour deposition of cathode sputtering means targets and anti-cathodes for radiography equipment.

In order to produce integrated circuits, it is necessary to deposit several thin films (of approximately one micrometer) of materials as different as aluminium, tungsten, silicon oxide, tungsten silicide, etc. These films can be obtained by chemical vapour deposition, etching, cathodic sputtering or physical vapour deposition.

Cathodic sputtering means use solid targets constituted by the material to be deposited in film form on the circuit. One cathodic sputtering variant, namely magnetron sputtering, permits improved performance characteristics as regards to the deposition speed and the working pressure, which makes it possible to obtain a greater purity of the films.

Without going into details regarding the magnetron sputtering means, which is well known, for its operation it is necessary to create an intense magnetic field parallel to the target. The difficulty of creating this field leads to solutions where the field is localized on the target. The latter being subject to electron bombardment is subject to wear in the form of a groove which finally passes through the target. It is then unusable and a large amount of expensive materials constituting the target is lost.

A very similar situation occurs in radiography equipment, where the anticathodes also are subject to local wear. These anti-cathodes can be produced in numerous different ways, but they all have a tungsten or tungsten-rhenium alloy surface. In order to produce X-rays, said surface is bombarded with a very localized accelerated electron beam. The anticathode rotates with an angular velocity of approximately 10,000 r.p.m. Thus, the very high energy electron beam embrittles the surface made from W or W/Re by partial recrystallization on a narrow groove. This wear finally makes the anticathode unusable.

The present invention proposes repairing the costly parts which have been locally damaged by adding a deposit of material constituting said parts in selective manner at the worn locations and in this way permitting the reuse thereof.

More specifically, the invention relates to a process for repairing a part having a locally damaged surface, characterized in that it consists of depositing in preferred manner at the damaged locations of said surface material constituting the latter and machining said surface of said part in such a way as to conceal its original state.

The parts may undergo a treatment prior to deposition. This treatment can consist of eliminating the damaged part of the surface by machining and grinding, followed e.g. by degassing.

In the same way following the deposition and finishing operations, the part can again undergo degassing.

Deposition can take place by any appropriate process, such as chemical vapour deposition, physical vapour deposition, electro-deposition, electrolysis by melted salts, etc. Preference is given to the use of (CVD), which makes it possible to obtain the greatest purity in the deposited materials for the highest deposition rates.

The preferred deposit can be obtained by locally heating the damaged surface locations. CVD consists of a chemical reaction, e.g. reduction, which only occurs above a certain temperature. By only heating the damaged points locally, the selectivity of the deposit is assisted.

The preferred deposit can also be obtained by selectively applying a jet of reactive gases to the damaged points of the part. In this case the hearing can either be of an overall or selective manner and in the latter case the two selection effects are added together to provide better efficiency.

The process according to the invention, combined with CVD technology, makes it possible to particularly effectively repair targets, whose constituent material is a refractory material (tungsten, (W), molybdenum (Mo), tantalum (Ta), titanium (Ti) in exemplified manner) or of silicide ($WSi_2$, $MoSi_2$, $TaSi_2$, $TiSi_2$,) or an alloy of refractory metals (WTi . . . ). It is obvious that the process is not limited to these materials.

EXAMPLES

1. Repairing a Tungsten Cathodic Sputtering Target

Characteristics of the damage

The damage results from wear along a groove on a radius of the target for circular targets or on a straight segment for rectangular targets.

Characteristics of the CVD

The parts are heated by induction by means of a coil inductor. The gases arrive in the vicinity of the part to be coated under laminar conditions. Currently one of the three following reaction types is used:

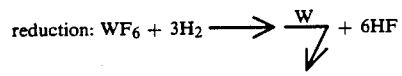

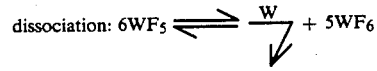

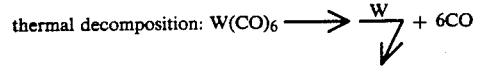

The pressure can be between 0.1 mbar and atmospheric pressure, 10 mbars being used. The temperature can be between 300° and 2,000° C., 800° C. being used.

Type of finishing

Eliminating the surface roughness by grinding the face of the deposit.

The target restored by the process according to the invention has the same characteristics as a new target and an equivalent quality. 99.995% purity deposits are possible.

2. Repairing a Mixed Fritting W-Re Anticathode From a Radiography Apparatus

Characteristic of the damage

The damage is due to a recrystallization of the W or W/Re or Mo active film over a thickness varying between approximately 100 and 350 micrometers. Recrystallization is characterized by a significant enlargement of the material grains and by the appearance of cracks, which reduce the efficiency of the anti-cathode.

The preliminary operations consist of eliminating the damaged part (the groove is hollowed out over a depth of approximately 400 microns) by machining and grinding and brief degassing of the part under a secondary vacuum and at a temperature between 1000° and 2500° C. The volatile impurities from the initial substrate are extracted.

The characteristics of the deposit are identical to those of Example 1. The reaction support material is W-Re.

Grinding the surface

A supplementary operation is degassing in order to obtain a greater purity of the material and extract the volatile impurities which have been trapped during machining.

This cycle of operation remains very economic compared with the cost of a new part. Therefore the process according to the invention makes it possible to reuse expensive parts which are at present disposed of.

We claim:

1. A process for repairing a refractory metal or refractory metals alloy x-ray anticathode having a surface with at least one locally damaged area, said process comprising:
   depositing material from which said surface is made onto said damaged area, said depositing being by chemical vapor deposition and said depositing being substantially limited to said damaged area; and
   machining said surface to conceal said damaged area, whereby an x-ray anticathode having no damaged areas is obtained.

2. A process according to claim 1, wherein said vapor deposition is a chemical vapor deposition.

3. A process according to claim 1 wherein, said deposition is obtained by locally heating said damaged locations of said surface.

4. A process according to claim 1 wherein, said deposition is obtained by selectively applying a jet of reactive gases to said damaged locations of said surface.

5. A process according to claim 1, wherein said vapor deposition is a physical vapor deposition.

* * * * *